(12) United States Patent
Kim

(10) Patent No.: US 9,874,886 B2
(45) Date of Patent: Jan. 23, 2018

(54) CIRCUIT AND METHOD FOR GENERATING REFERENCE VOLTAGE BASED ON TEMPERATURE COEFFICIENT

(71) Applicant: Samsung Electronics Co., Ltd., Suwon-si (KR)

(72) Inventor: Jong-cheol Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/265,872

(22) Filed: Sep. 15, 2016

(65) Prior Publication Data

US 2017/0147019 A1    May 25, 2017

(30) Foreign Application Priority Data

Nov. 23, 2015  (KR) .......................... 10-2015-0163983

(51) Int. Cl.
| | | |
|---|---|---|
| *G05F 1/10* | (2006.01) | |
| *G05F 1/46* | (2006.01) | |
| *G11C 11/4074* | (2006.01) | |
| *G11C 11/4099* | (2006.01) | |
| *G11C 5/14* | (2006.01) | |
| *G11C 7/04* | (2006.01) | |
| *G11C 7/14* | (2006.01) | |

(52) U.S. Cl.
CPC .............. *G05F 1/468* (2013.01); *G11C 5/147* (2013.01); *G11C 7/04* (2013.01); *G11C 11/4074* (2013.01); *G11C 11/4099* (2013.01); *G11C 7/14* (2013.01)

(58) Field of Classification Search
None
See application file for complete search history.

(56) References Cited

U.S. PATENT DOCUMENTS

| | | | | |
|---|---|---|---|---|
| 7,279,960 | B1 * | 10/2007 | Lee ......................... | G05F 3/242 327/538 |
| 7,280,407 | B2 * | 10/2007 | Umezawa .............. | G11C 5/145 365/185.18 |
| 7,643,889 | B2 | 1/2010 | Jeong et al. | |
| 7,889,575 | B2 * | 2/2011 | Wang ..................... | G11C 5/143 365/189.07 |
| 8,334,796 | B2 | 12/2012 | Wani et al. | |

(Continued)

FOREIGN PATENT DOCUMENTS

| | | |
|---|---|---|
| KR | 10-0851989 | 8/2008 |
| KR | 10-2012-0043522 | 5/2012 |

*Primary Examiner* — Lincoln Donovan
*Assistant Examiner* — Khareem E Almo
(74) *Attorney, Agent, or Firm* — Muir Patent Law, PLLC

(57) ABSTRACT

An integrated circuit may include a reference voltage generating circuit for generating a reference voltage. The reference voltage generating circuit may include a digital operation circuit and a digital-to-analog converter. The digital operation circuit is configured to adjust a reference voltage to temperature code relationship using a coefficient that adjusts a relative relationship between the reference voltage and the temperature code, and separate code that adjusts an absolute relationship between the reference voltage and the temperature code, wherein the temperature code reflects a temperature at the integrated circuit. The digital-to-analog converter is configured to generate the reference voltage based on an output from the digital operation circuit.

20 Claims, 20 Drawing Sheets

(56) References Cited

U.S. PATENT DOCUMENTS

| | | |
|---|---|---|
| 8,705,273 B2 | 4/2014 | Kim et al. |
| 8,710,898 B1 | 4/2014 | Chiang et al. |
| 8,981,817 B2 | 3/2015 | Kumar et al. |
| 9,331,707 B1* | 5/2016 | Blom .................. H03M 1/1047 |
| 2009/0237151 A1* | 9/2009 | Yoshida .................... G05F 3/02 327/539 |
| 2010/0060345 A1* | 3/2010 | Huang ...................... G05F 3/30 327/539 |
| 2010/0195412 A1* | 8/2010 | Furutani .................. G11C 8/06 365/189.05 |
| 2011/0205823 A1* | 8/2011 | Hemink ................... G11C 7/04 365/211 |
| 2012/0099388 A1 | 4/2012 | Lee et al. |
| 2012/0249114 A1* | 10/2012 | Sako ....................... G05F 1/561 323/312 |
| 2013/0009622 A1* | 1/2013 | Hu ........................... G05F 3/30 323/312 |
| 2013/0257517 A1* | 10/2013 | Kawashima ........... G01R 19/32 327/513 |
| 2014/0145701 A1 | 5/2014 | Temkine et al. |
| 2014/0320097 A1 | 10/2014 | Kwon |
| 2015/0277456 A1* | 10/2015 | Illing ........................ G05F 1/10 323/265 |
| 2016/0349786 A1* | 12/2016 | Fronczak ................ G05F 3/267 |

\* cited by examiner

US 9,874,886 B2

CIRCUIT AND METHOD FOR GENERATING REFERENCE VOLTAGE BASED ON TEMPERATURE COEFFICIENT

CROSS-REFERENCE TO RELATED APPLICATION

This application claims the benefit of Korean Patent Application No. 10-2015-0163983, filed on Nov. 23, 2015, in the Korean Intellectual Property Office, the disclosure of which is incorporated herein in its entirety by reference.

BACKGROUND

The present disclosure relates to generation of a reference voltage, and more particularly, to a circuit and method for generating a reference voltage based on a temperature coefficient.

A device included in an integrated circuit may have characteristics that vary with temperature. For example, a threshold voltage of a transistor may change when a temperature around the transistor increases or decreases. An integrated circuit may include a temperature sensor for detecting a temperature of the integrated circuit and may compensate for the characteristics of a device that vary with temperature based on a temperature code provided by the temperature sensor.

A reference voltage may be used in an integrated circuit for various purposes, and a normal operation of the integrated circuit may be ensured or the performance of the integrated circuit may be improved as an accuracy of the reference voltage increases. For a device whose characteristics change as a temperature of an integrated circuit increases or decreases, a reference voltage may also be generated to change according to a temperature change. When an amount by which the reference voltage changes according to a temperature change is inaccurate, the integrated circuit may operate abnormally.

SUMMARY

Various aspects of the inventive concept provide generation of a reference voltage, and more particularly provide a circuit and method of generating a reference voltage that accurately changes according to a temperature change.

An integrated circuit may include a temperature sensor configured to provide a temperature code by detecting a temperature of the integrated circuit; a parameter storage circuit configured to store and provide a temperature coefficient for adjusting a relative change amount of a reference voltage that varies in relation to the temperature of the integrated circuit, an offset code for compensating for a first, absolute offset of the reference voltage, and an offset coefficient for compensating for a second, relative offset of the reference voltage in relation to the temperature of the integrated circuit; and a reference voltage generating circuit configured to generate the reference voltage by performing a digital calculation on the temperature code, the temperature coefficient, the offset code, and the offset coefficient.

For example, the integrated circuit may include a reference voltage generating circuit for generating a reference voltage. The reference voltage generating circuit may include a digital operation circuit and a digital-to-analog converter. The digital operation circuit is configured to adjust a reference voltage to temperature code relationship using a coefficient that adjusts a relative relationship between the reference voltage and the temperature code, and separate code that adjusts an absolute relationship between the reference voltage and the temperature code, wherein the temperature code reflects a temperature at the integrated circuit. The digital-to-analog converter is configured to generate the reference voltage based on an output from the digital operation circuit.

A method of generating a reference voltage in an integrated circuit may include (a) receiving a temperature code for indicating a temperature of the integrated circuit; (b) adjusting a reference voltage to temperature code relationship using a first coefficient that adjusts a gradient of a relationship between the reference voltage and the temperature code; (c) adjusting the reference voltage to temperature code relationship using an offset code that equally adjusts the value of each reference voltage in relation to a corresponding temperature code; and (d) generating the reference voltage based on the adjusted reference voltage to temperature code relationship from (b) and (c).

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
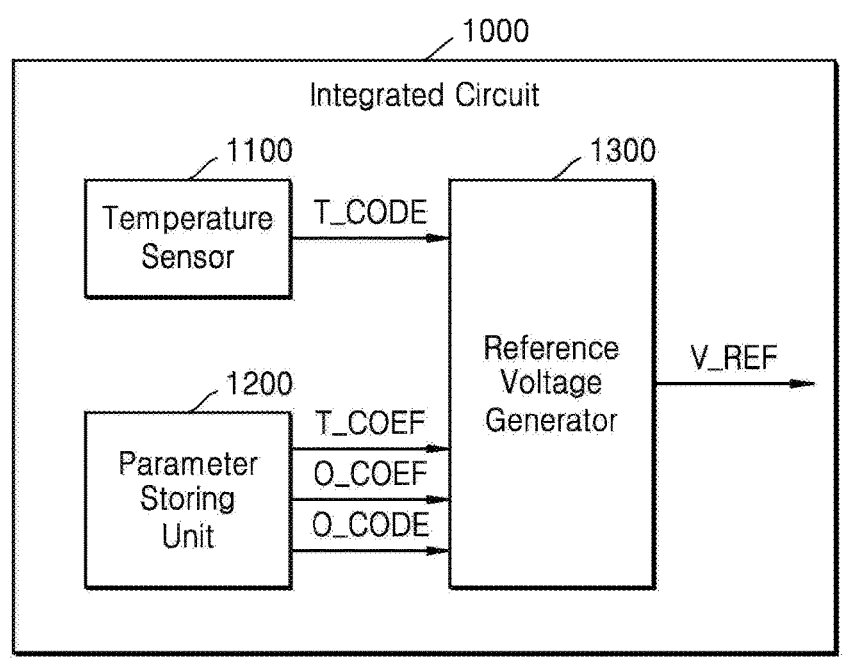
FIG. 1 is a block diagram of an integrated circuit according to one embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," or "equal," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," or "substantially equal," may be exactly the same or equal, or may be the same, or equal, within acceptable variations that may occur, for example, due to manufacturing processes.

FIG. 1 is a block diagram of an integrated circuit 1000 according to one embodiment. The integrated circuit 1000 that is a set of electronic circuits manufactured by using a semiconductor process may be, for example, a memory device, a general processor, an analog-to-digital converter (ADC), a digital-to-analog converter (DAC), a power management integrated circuit (PMIC), or an interface circuit.

A reference voltage V_REF may be generated in the integrated circuit 1000 and may be used for various purposes. For example, the reference voltage V_REF may be used to determine a level of an analog signal and to generate an analog signal having a desired level. When the reference voltage V_REF is accurate, a normal operation of the integrated circuit 1000 may be ensured and the performance of the integrated circuit 1000 may be improved.

A device included in the integrated circuit 1000 may have characteristics that depend on a temperature. For example, a threshold voltage of a metal-oxide-semiconductor field-effect transistor (MOSFET) may change as a temperature around the MOSFET increases or decreases. In order to compensate for the characteristics of the device which depend on a temperature, the integrated circuit 1000 may control the device according to a temperature of the integrated circuit 1000. For example, the integrated circuit 1000 may change the reference voltage V_REF so that the characteristics of the device, which depend on a temperature, are compensated for. For example, when the reference voltage V_REF increases as a temperature increases, the reference voltage V_REF may be referred to as a voltage having a positive temperature coefficient (PTC). In contrast, when the reference voltage V_REF decreases as a temperature increases, the reference voltage V_REF may be referred to as a voltage having a negative temperature coefficient (NTC). When an amount (referred to as a change amount) by which the reference voltage V_REF changes according to a temperature change is accurate, a normal operation of the integrated circuit 1000 may be ensured irrespective of the temperature change. According to an embodiment, the reference voltage V_REF that accurately changes according to a temperature change may be provided, and thus the integrated circuit 1000 that normally operates without being affected by the temperature change may be provided.

Referring to FIG. 1, the integrated circuit 1000 may include a temperature sensor 1100, a parameter storage unit 1200, also referred to as a parameter storing unit 1200, and a reference voltage generator (or a reference voltage generating circuit) 1300. The temperature sensor 1100 may detect a temperature of the integrated circuit 1000 and may generate a temperature code T_CODE corresponding to a level of the detected temperature (e.g., a temperature of or at the integrated circuit 1000). The temperature code T_CODE, which in one embodiment is a digital signal, may be provided to the reference voltage generator 1300 as shown in FIG. 1, and may be used to generate the reference voltage V_REF. As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The parameter storing unit 1200, described below as a parameter storage unit 1200, and alternatively described as a parameter storing circuit 1200, may store a plurality of parameters that are used by the reference voltage generator 1300 to generate the reference voltage V_REF, and may provide the plurality of parameters to the reference voltage generator 1300. For example, as shown in FIG. 1, the parameter storage unit 1200 may store a temperature coefficient T_COEF, an offset coefficient O_COEF, and an offset code O_CODE, and may provide the temperature coefficient T_COEF, the offset coefficient O_COEF, and the offset code O_CODE to the reference voltage generator 1300. The temperature coefficient T_COEF may digitally indicate a change amount of the reference voltage V_REF which depends on a temperature of the integrated circuit 1000, the offset coefficient O_COEF may digitally indicate a value for compensating for an offset of the reference voltage V_REF which depends on the temperature code T_CODE, and the offset code O_CODE may digitally indicate a value for compensating for an offset of the reference voltage V_REF which is independent from the temperature code T_CODE. The temperature coefficient T_COEF, the offset coefficient O_COEF, and the offset code O_CODE may be stored as preset values in the parameter storage unit 1200. The temperature coefficient T_COEF, the offset coefficient O_COEF, and the offset code O_CODE will be explained below in detail with reference to FIGS. 6 and 7, and the parameter storage unit 1200 will be explained below in detail with reference to FIGS. 8, 9A, and 9B.

The reference voltage generator 1300, also described as a reference voltage generating circuit, may receive the temperature code T_CODE, the temperature coefficient T_COEF, the offset coefficient O_COEF, and the offset code O_CODE that are digital signals, and may generate the reference voltage V_REF. As described below with reference to FIG. 2, the reference voltage generator 1300 may generate the reference voltage V_REF by performing a digital calculation on the temperature code T_CODE, the temperature coefficient T_COEF, the offset coefficient O_COEF, and the offset code O_CODE. Accordingly, an error that occurs when analog signals respectively corresponding to the plurality of parameters are processed, for example, amplified, divided, added, or integrated may be removed. Also, as described below, the reference voltage generator 1300 may generate the reference voltage V_REF that is accurate by using the offset coefficient O_COEF in order to accurately compensate for an error caused by a DAC.

Figure 2:
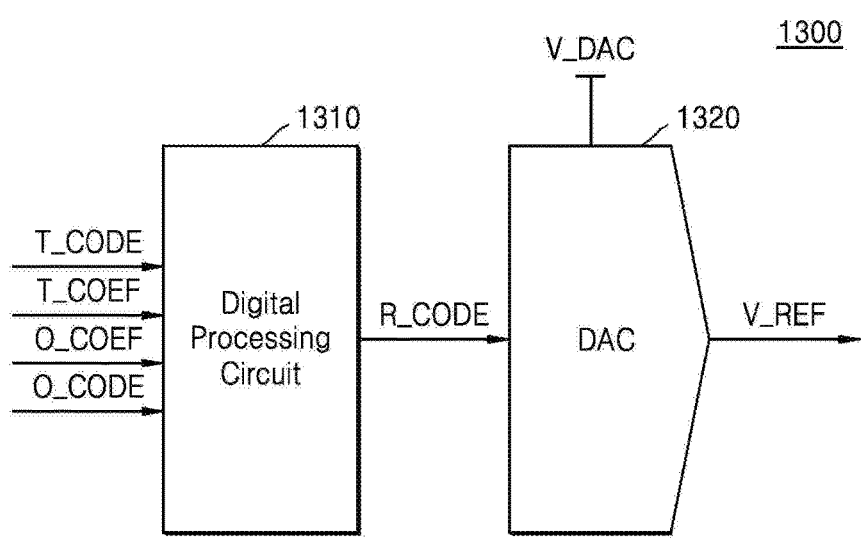
FIG. 2 is a block diagram of a reference voltage generator of FIG. 1 according to one embodiment.

FIG. 2 is a block diagram of the reference voltage generator 1300 of FIG. 1 according to an embodiment. As described above with reference to FIG. 1, the reference voltage generator 1300 may receive the temperature code T_CODE, the temperature coefficient T_COEF, the offset coefficient O_COEF, and the offset code O_CODE that are digital signals, and may generate the reference voltage V_REF. Referring to FIG. 2, the reference voltage generator 1300 may include a digital processing circuit 1310 and a DAC 1320.

The digital processing circuit 1310 may receive the temperature code T_CODE, the temperature coefficient T_COEF, the offset coefficient O_COEF, and the offset code O_CODE that are digital signals, and may generate a reference code R_CODE. The reference code R_CODE that is a digital signal having a value corresponding to a level of the reference voltage V_REF may be converted by the DAC 1320 into the reference voltage V_REF that is an analog signal.

The digital processing circuit 1310 may generate the reference code R_CODE by performing a digital calculation on the temperature code T_CODE, the temperature coefficient T_COEF, the offset coefficient O_COEF, and the offset code O_CODE. For example, the reference code R_CODE may be digitally calculated by the digital processing circuit 1310. For example, as explained below with reference to FIG. 6, the digital processing circuit 1310 may add the temperature coefficient T_COEF and the offset coefficient O_COEF, and may generate the reference code R_CODE by adding a product of the temperature code T_CODE and a sum of the temperature coefficient T_COEF and the offset coefficient O_COEF to the offset code O_CODE. The combined temperature coefficient T_COEF and offset coefficient O_COEF may be referred to together simply as a coefficient, or a first coefficient. The offset code O_CODE may be referred to as a separate code, and it forms a separate, independent part of the equation for determining the reference code R_CODE.

The DAC 1320 that is a circuit for generating an analog signal by converting a received digital signal may generate the reference voltage V_REF by converting the reference code R_CODE as shown in FIG. 2. The DAC 1320 may receive a DAC voltage V_DAC that is a direct current (DC) voltage, and may convert a digital signal into an analog signal by referring to the DAC voltage V_DAC. As described below with reference to FIGS. 4 and 5, a deviation of the DAC voltage V_DAC may cause an error between the reference code R_CODE and the reference voltage V_REF and may cause an error between the temperature code T_CODE and the reference code R_CODE. The digital processing circuit 1310 according to an embodiment may accurately compensate for an error caused by a deviation of the DAC voltage V_DAC by using the offset coefficient O_COEF and the offset code O_CODE, and thus the reference voltage V_REF that is accurate may be generated.

Figure 3A:
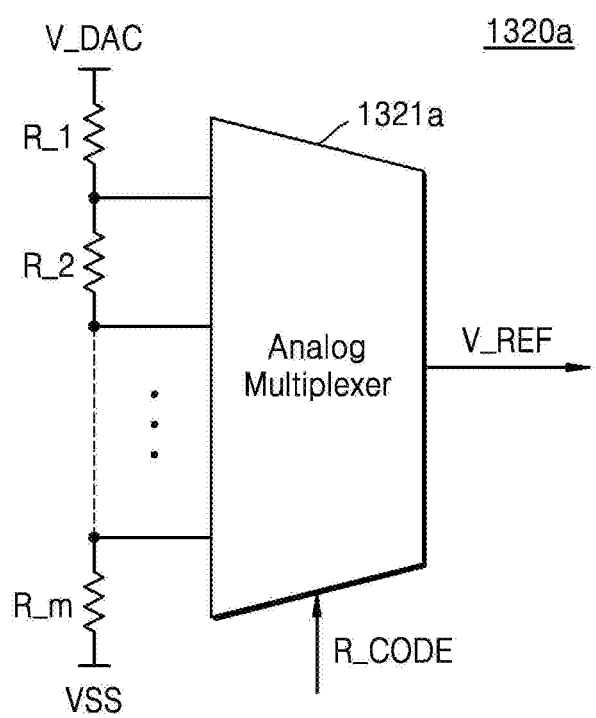
FIGS. 3A and 3B are diagrams illustrating examples of a digital-to-analog converter (DAC) of FIG. 2 according to certain embodiments.
Figure 3B:
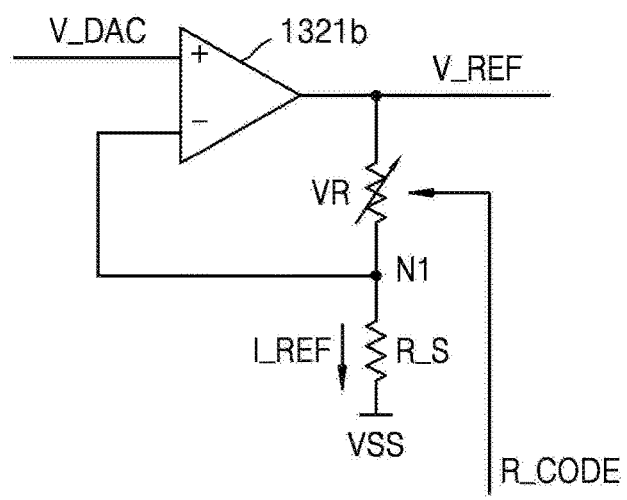

FIGS. 3A and 3B are diagrams illustrating examples of the DAC 1320 of FIG. 2 according to certain embodiments. As described above with reference to FIG. 2, the DAC 1320 may convert the reference code R_CODE into the reference voltage V_REF by referring to the DAC voltage V_DAC, and thus conversion of the reference code R_CODE to the reference voltage V_REF may be based on the voltage V_DAC. DACs 1320a and 1320b of FIGS. 3A and 3B are exemplary, and the DAC 1320 of FIG. 2 may be modified in other ways.

Referring to FIG. 3A, the DAC 1320a may include a plurality of resistors R_1 through R_m that are connected in series and an analog multiplexer 1321a. The plurality of resistors R_1 through R_m may be connected between the DAC voltage V_DAC and a ground voltage VSS, and may provide a plurality of voltages obtained by dividing the DAC voltage V_DAC to the analog multiplexer 1321a through a plurality of nodes formed by the resistors R_1 through R_m.

For example, the resistors R_1 through R_m may have substantially the same resistance, and thus a plurality of voltages obtained by uniformly dividing the DAC voltage V_DAC may be provided to the analog multiplexer 1321a. A deviation of a resistance of each of the resistors R_1 through R_m, which is caused by a semiconductor process, may be relatively small, and thus the DAC voltage V_DAC may be accurately divided. However, a deviation of the DAC voltage V_DAC may cause an error in each of the divided voltages.

The analog multiplexer 1321a may receive the reference code R_CODE and a plurality of voltages divided from the DAC voltage V_DAC, and may generate the reference voltage V_REF. The analog multiplexer 1321a may output one of the plurality of voltages provided from the plurality of nodes formed by the resistors R_1 through R_m that are connected in series as the reference voltage V_REF based on the reference code R_CODE.

Referring to FIG. 3B, the DAC 1320b may include an operational amplifier OPAMP 1321b, a resistor R_S, and a variable resistor VR. The operational amplifier OPAMP 1321b may have a non-inverting input to which the DAC voltage V_DAC is applied and an inverting input connected to a first node N1, and may output the reference voltage V_REF. Due to a negative feedback, the inverting input of the operational amplifier OPAMP 1321b, that is, a voltage of the first node N1, may be substantially the same as the DAC voltage V_DAC. Accordingly, voltages on both ends of the resistor R_S may be maintained constant, and a reference current I_REF may be generated. As such, the operational amplifier OPAMP 1321b and the resistor R_S may function as a current source for providing a current that has a constant level and passes through the variable resistor VR.

The variable resistor VR may have a resistance that changes according to the reference code R_CODE. Since the reference current I_REF passes through the variable resistor VR as described above, a level of the reference voltage V_REF may change as the resistance of the variable resistor VR changes. As such, the reference voltage V_REF whose level changes according to the reference code R_CODE may be generated.

In FIG. 3B, the reference voltage V_REF may have an error due to the operational amplifier OPAMP 1321b as well as the DAC voltage V_DAC. For example, the operational amplifier OPAMP 1321b may have an input offset error indicating a voltage difference between a non-inverting input and an inverting input, and a voltage of the first node N1 connected to the inverting input and the DAC voltage V_DAC of the non-inverting input may be different from each other by the input offset error. Since a level of the reference current I_REF changes due to the input offset error of the operational amplifier OPAMP 1321b, the reference voltage V_REF may have an error.

Although the following will be explained on the assumption that the DAC 1320 of FIG. 2 has the same structure as that of the DAC 1320a of FIG. 3A for convenience of explanation, the inventive concept is not limited thereto.

Figure 4:
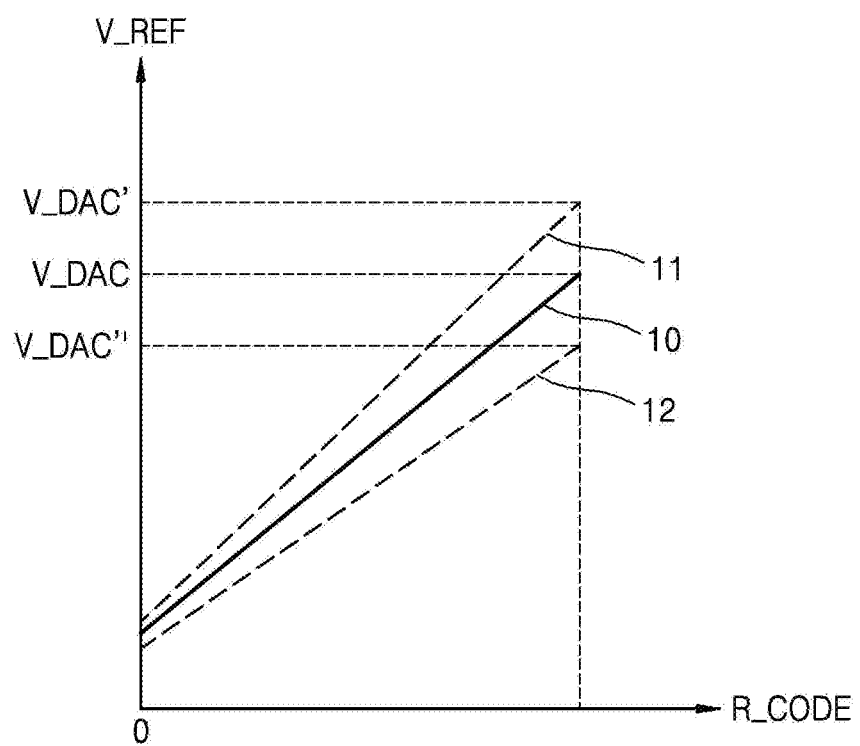
FIG. 4 is a graph illustrating an error that occurs in the DAC of FIGS. 3A and 3B due to a deviation of a DAC voltage.

FIG. 4 is a graph for explaining an error that occurs in the DAC 1320 of FIGS. 3A and 3B due to a deviation of the DAC voltage V_DAC. In the graph of FIG. 4, the horizontal axis represents the reference code R_CODE that is a digital signal input to the DAC 1320, and the vertical axis represents the reference voltage V_REF that is an analog signal output from the DAC 1320.

Referring to FIG. 4, a line 10 represents a level of the reference voltage V_REF according to the reference code R_CODE when the DAC voltage V_DAC is maintained at a desired level. Also, lines 11 and 12 represent a level of the reference voltage V_REF according to the reference code R_CODE when a deviation occurs in the DAC voltage V_DAC due to a semiconductor process or other factors. In detail, the line 11 represents a level of the reference voltage V_REF according to the reference code R_CODE when the DAC voltage V_DAC has a positive deviation (that is, when V_DAC' is provided to the DAC 1320), and the line 12 represents a level of the reference voltage V_REF according to the reference code R_CODE when the DAC voltage V_DAC has a negative deviation (that is, when V_DAC" is provided to the DAC 1320).

A deviation of the DAC voltage V_DAC may cause errors of the reference voltage V_REF which change according to values of the reference code R_CODE. For example, as shown in FIG. 4, a size of an error of the reference voltage V_REF may increase as a value of the reference code R_CODE increases, as marked by a gradient of each line in the graph of FIG. 4. Referring to FIG. 3A, a deviation of the DAC voltage V_DAC may cause voltages of the nodes formed by the plurality of resistors R_1 through R_m that are connected in series to increase or decrease at the same ratio. Accordingly, a level of a voltage corresponding to a least significant bit (LSB) of a code in the DAC 1320 may change, and thus a size of an error of the reference voltage V_REF may increase as a value of the reference code R_CODE increases. Accordingly, there may be a limitation in compensating for an error of the reference voltage V_REF caused by a deviation of the DAC voltage V_DAC by using the reference code R_CODE that is compensated for by adding or subtracting a predetermined value.

Figure 5:
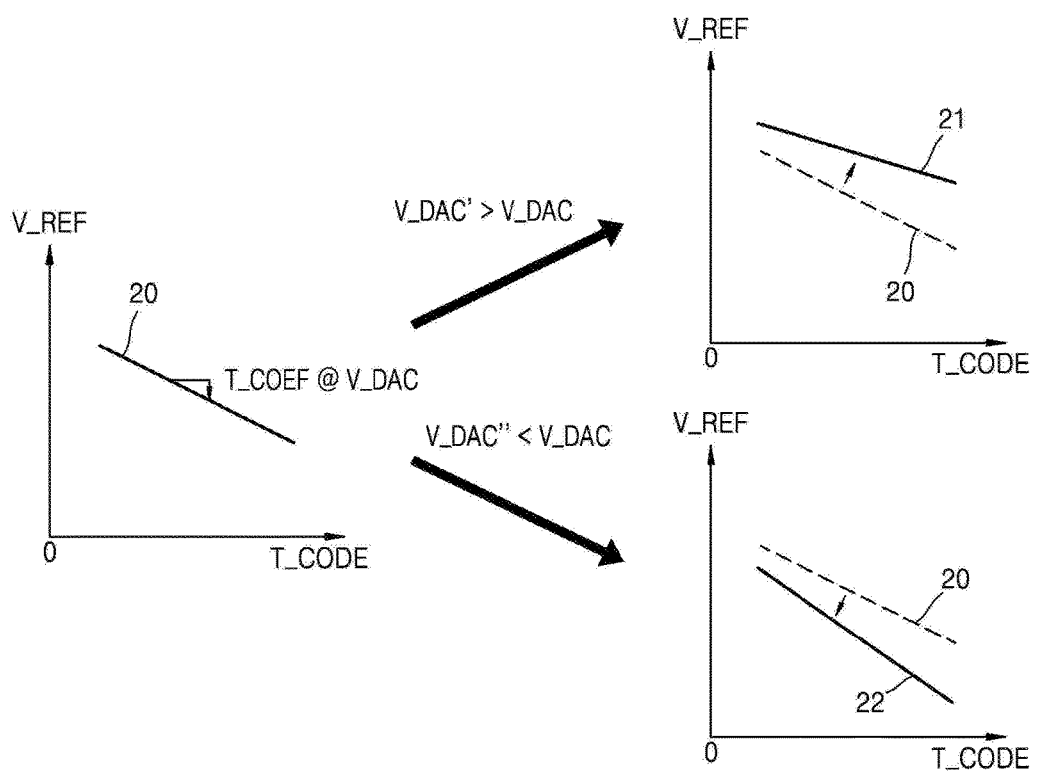
FIG. 5 shows graph for explaining an error that occurs in a reference voltage according to a temperature change due to a deviation of the DAC voltage.

FIG. 5 shows graphs for explaining an error that occurs in the reference voltage V_REF according to a temperature change due to a deviation of the DAC voltage V_DAC. In the graphs of FIG. 5, the horizontal axis represents the temperature code T_CODE having a value that changes according to a temperature change of the integrated circuit 1000 and the vertical axis represents the reference voltage V_REF according to the temperature code T_CODE. In detail, in FIG. 5, a line 20 represents a level of the reference voltage V_REF according to the temperature code T_CODE when the DAC voltage V_DAC is maintained at a desired level. Also, in FIG. 5, lines 21 and 22 represent a level of the reference voltage V_REF according to the temperature code T_CODE when a deviation occurs in the DAC voltage V_DAC.

Referring to the graph of FIG. 5 located on the left side, the temperature coefficient T_COEF may be determined so that the reference voltage V_REF regularly changes according to the temperature code T_CODE. As described above, the reference voltage V_REF may change according to a temperature change for a device having characteristics that change according to a temperature change of the integrated circuit 1000, and a change amount of the reference voltage V_REF according to a temperature change may be determined based on the characteristics of the device which change according to a temperature change. For example, as shown in the graph of FIG. 5 located on the left side, due to the characteristics of the device, the reference voltage V_REF may have an NTC and the temperature coefficient T_COEF may be determined. When the DAC voltage V_DAC is maintained at a desired level, for example, when the DAC voltage V_DAC does not have a deviation, the temperature coefficient T_COEF and the reference voltage V_REF may have a relationship such as the line 20 of FIG. 5.

Referring to the graph of FIG. 5 on the upper right side, when a positive deviation occurs in the DAC voltage V_DAC (that is, when V_DAC' is provided to the DAC 1320), the reference voltage V_REF may have a positive error and a size of an error of the reference voltage V_REF may increase as a value of the temperature code T_CODE increases. As shown, the line 21 may have a gradient and an offset different from those of the line 20.

Referring to the graph of FIG. 5 on the lower right side, when a negative deviation occurs in the DAC voltage V_DAC (that is, when V_DAC" is provided to the DAC 1320), the reference voltage V_REF may have a negative error and a size of an error of the reference voltage V_REF may increase as a value of the temperature code T_CODE increases. As shown, the line 22 may have a gradient and an offset different from those of the line 20.

Figure 6:
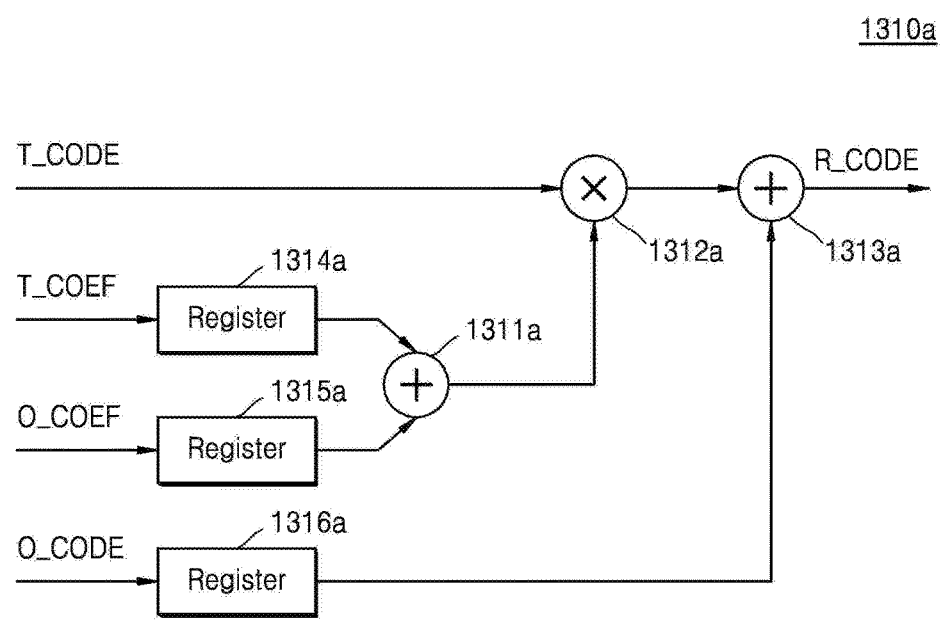
FIG. 6 is a diagram illustrating an example of a digital processing circuit of FIG. 2 according to one embodiment.

FIG. 6 is a diagram illustrating an example of the digital processing circuit 1310 of FIG. 2 according to one embodiment. As described above, the digital processing circuit 1310 may receive the temperature code T_CODE, the temperature coefficient T_COEF, the offset coefficient O_COEF, and the offset code O_CODE that are digital signals, and may generate the reference code R_CODE. The temperature code T_CODE provided from the temperature sensor 1100 (see FIG. 1) may have a value that changes according to a temperature of the integrated circuit 1000. Also, the temperature coefficient T_COEF, the offset coefficient O_COEF, and the offset code O_CODE provided from the parameter storage unit 1200 (see FIG. 1) may have preset values. Referring to FIG. 6, the digital processing circuit 1310a may include first and second adders 1311a and 1313a, a multiplier 1312a, and registers 1314a through 1316a.

According to one embodiment, the digital processing circuit 1310a may add the temperature coefficient T_COEF and the offset coefficient O_COEF, and may generate the reference code R_CODE by adding a product of the temperature code T_CODE and a sum of the temperature coefficient T_COEF and the offset coefficient O_COEF to the offset code O_CODE. That is, the reference code R_CODE may be calculated as follows.

$$R\_CODE = (T\_COEF + O\_COEF) \times T\_CODE + O\_CODE$$

As described above with reference to FIG. 5, the temperature coefficient T_COEF may be previously determined in order to compensate for characteristics of a device that change according to a temperature change. Also, the offset coefficient O_COEF and the offset code O_CODE may be previously determined in order to compensate for an error caused by the DAC 1320. For example, the offset coefficient O_COEF and the offset code O_CODE may be used in order to move the lines 21 and 22 in the graphs of FIG. 5 located on the right side to the line 20. In detail, gradients of the lines 21 and 22 may be changed by the offset coefficient O_COEF and vertical positions of the lines 21 and 22 may be changed by the offset code O_CODE. Functions of the offset coefficient O_COEF and the offset code O_CODE will be explained below in detail with reference to FIG. 8.

Referring to FIG. 6, the registers 1314a through 1316a may respectively store parameters received from the parameter storage unit 1200, for example, the temperature coefficient T_COEF, the offset coefficient O_COEF, and the offset code O_CODE. The registers 1314a through 1316a may provide values stored in the first adder 1311a and the second adder 1313a and may maintain values stored while the first adder 1311a and the second adder 1313 perform operations. Although not shown in FIG. 6, the digital processing circuit 1310a may further include a register for storing the temperature code T_CODE received from the temperature sensor 1100 (see FIG. 1) and providing the temperature code T_CODE to the multiplier 1312a.

Each of the first and second adders 1311a and 1313a and the multiplier 1312a may include a plurality of gates including at least one transistor. The first adder 1311a may receive the temperature coefficient T_COEF and the offset coefficient O_COEF from the registers 1314a and 1315a, and may add the temperature coefficient T_COEF and the offset coefficient O_COEF. The multiplier 1312a may multiply the temperature code T_CODE received from the temperature sensor 1100 by an output of the first adder 1311a (that is, a sum of the temperature coefficient T_COEF and the offset coefficient O_COEF). The second adder 1313a may output the reference code R_CODE by adding the offset code O_CODE received from the register 1316a and an output of the multiplier 1312a (that is, a product of the output of the first adder 1311a and the temperature code T_CODE).

As shown in FIG. 6, the digital processing circuit 1310a may generate the reference code R_CODE that is accurate by performing a digital calculation on the temperature code T_CODE and a plurality of parameters (that is, the temperature coefficient T_COEF, the offset coefficient O_COEF, and the offset code O_CODE) As such, devices used to generate analog signals respectively corresponding to the temperature coefficient T_COEF and the plurality of parameters may be omitted, and an error of the reference voltage V_REF which occurs when the generated analog signals are processed may be removed. Also, an error caused by the DAC 1320 of FIG. 2 may also be accurately removed by multiplying the offset code O_CODE as well as the temperature coefficient T_COEF by the temperature code T_CODE.

Figure 7:
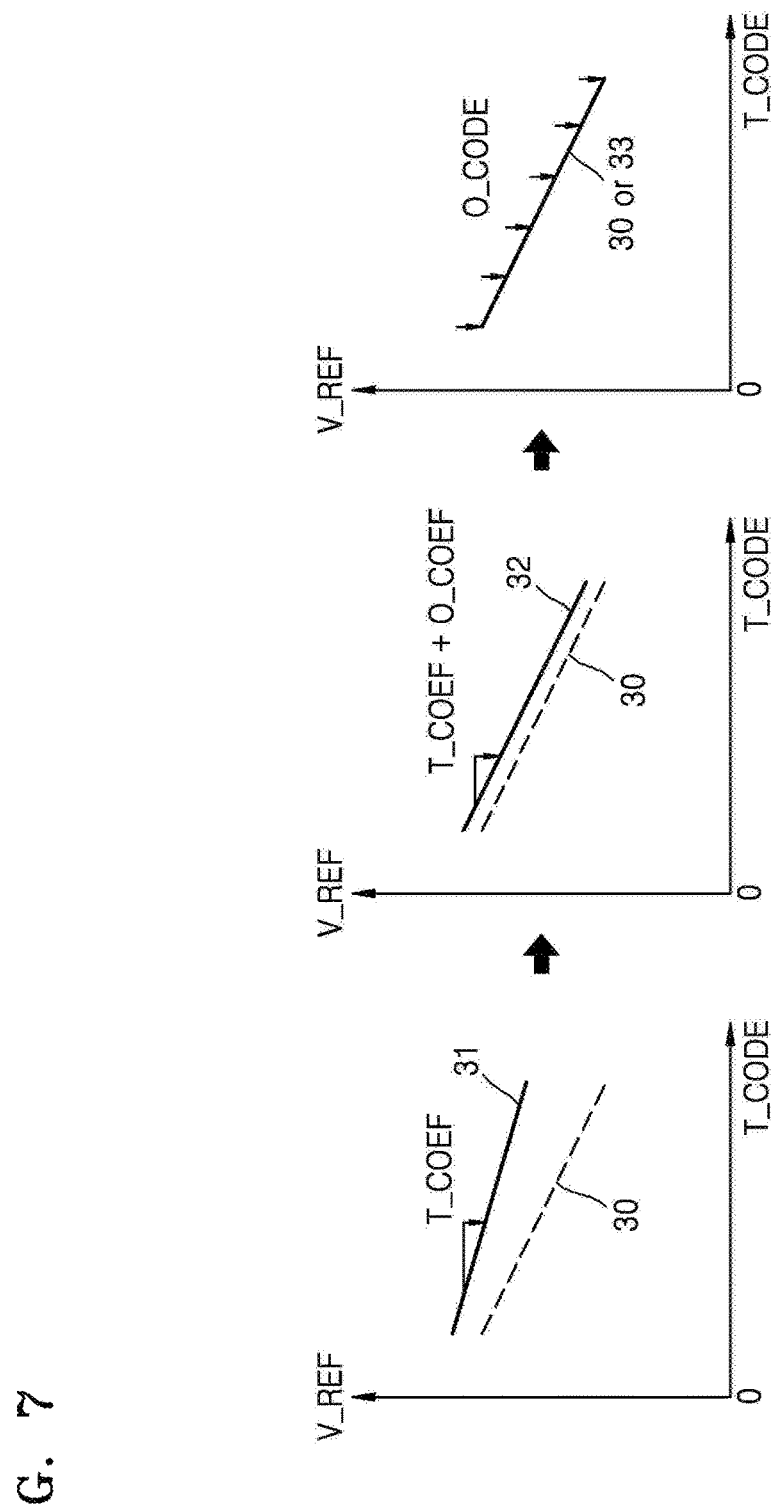
FIG. 7 shows graphs for explaining a process of removing an error of the reference voltage according to one embodiment.

FIG. 7 shows graphs for explaining a process of removing an error of the reference voltage V_REF according to one embodiment. In detail, FIG. 7 shows graphs for explaining a process of removing an error of the reference voltage V_REF caused by the digital processing circuit 1310a of FIG. 6, especially, a process of removing an error that occurs in the reference voltage V_REF when the DAC voltage V_DAC has a positive deviation (for example, when V_DAC' of FIGS. 4 and 5 is provided to the DAC 1320). In the graphs of FIG. 7, the horizontal axis represents the temperature code T_CODE having a value that changes according to a temperature change of the integrated circuit 1000 and the vertical axis represents the reference voltage V_REF. Also, a line 30 represents a relationship between the temperature code T_CODE and the reference voltage V_REF when the DAC voltage V_DAC is maintained at a desired level. FIG. 7 will be explained with reference to FIG. 6.

Referring to the graph of FIG. 7 located on the left side, when only the temperature coefficient T_COEF that is determined by characteristics of a device to which the reference voltage V_REF is provided is reflected, the temperature code T_CODE and the reference voltage V_REF may have a relationship such as a line 31 due to an error caused by the DAC 1320. As shown in the graph of FIG. 7 located on the left side, the line 31 may have a gradient and a vertical position different from those of the line 30.

Referring to the graph of FIG. 7 located in the middle, when the offset coefficient O_COEF is additionally reflected, the temperature code T_CODE and the reference voltage V_REF may have a relationship such as a line 32. For example, a sum of the temperature coefficient T_COEF and the offset coefficient O_COEF obtained by the first adder 1311a may be multiplied by the temperature code T_CODE by the multiplier 1312a, and thus a gradient of the line 31 may change to a gradient of the line 32. As shown in the graph of FIG. 7 located in the middle, the line 32 may have a vertical position different from that of the line 30 and may have substantially the same gradient as that of the line 30.

Referring to the graph of FIG. 7 located on the right side, when the offset code O_CODE is additionally reflected, the temperature code T_CODE and the reference voltage V_REF may have a relationship such as a line 33. That is, an output of the multiplier 1312a and the offset code O_CODE may be added by the second adder 1313a, and thus a vertical position of the line 33 may change. As shown in the graph of FIG. 7 located on the right side, the line 33 may be substantially the same as the line 30.

Thus, as depicted in FIG. 7, a temperature code T_CODE to reference voltage V_REF relationship can be affected by certain device characteristics (e.g., a DAC input voltage V_DAC), which can make the relationship vary from an ideal relationship. A change in the relationship can be undesirable. Varying device characteristics can change the relationship in an absolute manner (e.g., all temperature codes T_CODE result in an equally higher or lower reference voltage V_REF), and/or in a relative manner (e.g., smaller temperature codes T_CODE result in smaller changes in reference voltage from an ideal relationship, and larger temperature codes T_CODE result in larger changes in reference voltage from an ideal relationship). In some embodiments, a first circuit or digital calculation is employed to adjust for relative changes in the temperature code T_CODE to reference voltage V_REF relationship, and a second circuit or digital calculation is employed to adjust for absolute changes in the temperature code T_CODE to reference voltage V_REF relationship. The two circuits and two equations may be combined or viewed as a single circuit and a single equation, each having different parts. For example, by multiplying the temperature code T_CODE by a coefficient, the gradient of the temperature code T_CODE may be changed to counteract certain device variations. In this manner, coefficients such as a temperature coefficient T_COEF and an offset coefficient O_COEF may be used and may depend on the temperature code T_CODE (e.g., by being multiplied by the T_CODE) to adjust the gradient of the T_CODE to V_REF relationship in a relative manner. A separate code, such as an offset code O_CODE, which may represent an independent value, may be used to adjust the T_CODE to V_REF relationship in an absolute manner. The offset code O_CODE may therefore adjust the T_CODE to V_REF relationship independently from the T_CODE, and may equally adjust or offset the value of each reference voltage in relation to a corresponding temperature code. The different coefficients and codes, such as the temperature coefficient T_COEF, offset coefficient O_COEF, and offset code O_CODE, may each be set and may depend on different physical parameters of the integrated circuit, such as a voltage input to a DAC circuit or other factors, as further described herein.

Figure 8:
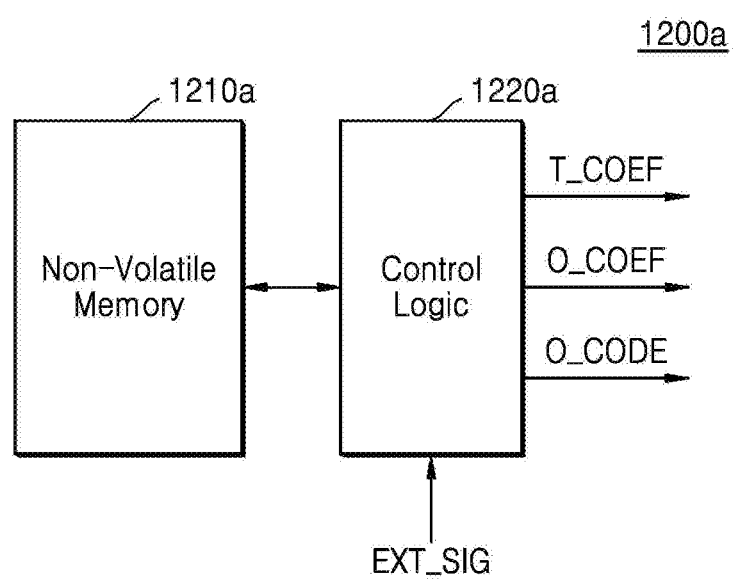
FIG. 8 is a block diagram illustrating an example of a parameter storage unit of FIG. 1 according to one embodiment.

FIG. 8 is a block diagram illustrating an example of the parameter storage unit 1200 of FIG. 1 according to an embodiment. As described above with reference to FIG. 1, the parameter storage unit 1200 may provide a plurality of parameters, for example, the temperature coefficient T_COEF, the offset coefficient O_COEF, and the offset code O_CODE, to the reference voltage generator 1300. Referring to FIG. 8, a parameter storage unit 1200a may include a nonvolatile memory 1210a and a control logic 1220a.

The nonvolatile memory 1210a that is a memory for maintaining stored data even when power supply is cut off may store the temperature coefficient T_COEF, the offset coefficient O_COEF, and the offset code O_CODE according to one embodiment. Examples of the nonvolatile memory 1210 may include, but are not limited to, an electrically erasable programmable read-only memory (EEPROM), a flash memory, a phase change random-access memory (PRAM), a resistance random-access memory (RRAM), a nano floating gate memory (NFGM), a polymer random-access memory (PoRAM), a magnetic random-access memory (MRAM), and a ferroelectric random-access memory (FRAM).

The control logic 1220a may access the nonvolatile memory 1210a, may read parameters, and may output the read parameters. Also, the control logic 1220a may receive an external signal EXT_SIG from the outside of the parameter storage unit 1200a, and may write parameters to the nonvolatile memory 1210a in response to the external signal EXT_SIG. An operation of writing parameters to the nonvolatile memory 1210a in response to the external signal EXT_SIG will now be explained in detail with reference to FIGS. 9A and 9B.

Figure 9A:
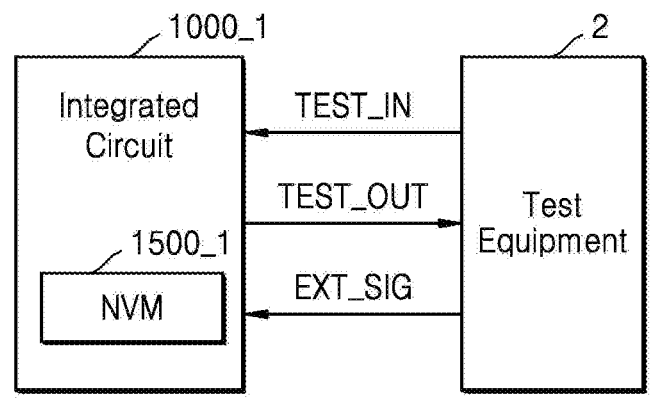
FIGS. 9A and 9B are block diagrams for explaining a process of writing parameters to a nonvolatile memory according to certain embodiments.
Figure 9B:
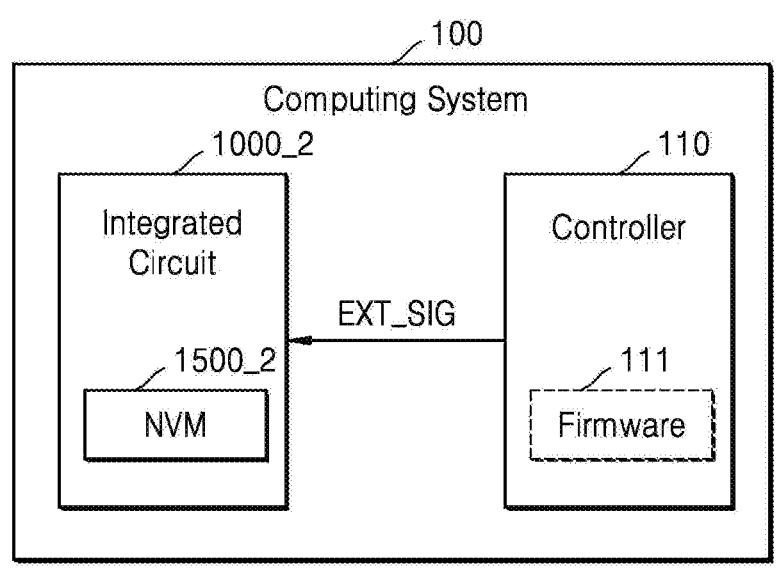

FIGS. 9A and 9B are block diagrams for explaining a process of writing parameters to the nonvolatile memory according to certain embodiments. As described above with reference to FIG. 8, the parameter storage unit 1200a may include the nonvolatile memory 1210a, and may write parameters to the nonvolatile memory 1210a based on the external signal EXT_SIG.

Referring to FIG. 9A, an integrated circuit 1000_1 may be tested by test equipment 2 before shipping. That is, the integrated circuit 1000_1 may be connected to the test equipment 2, and the test equipment 2 may transmit a test input signal TEST_IN to the integrated circuit 1000_1 and may receive a test output signal TEST_OUT from the integrated circuit 1000_1. For example, when the integrated circuit 1000_1 is a memory device, the test equipment 2 may transmit the test input signal TEST_IN for writing test data or reading data to the integrated circuit 1000_1. The test equipment 2 may receive data read from the integrated circuit 1000_1 as the test output signal TEST_OUT.

The test equipment 2 may transmit the external signal EXT_SIG to the integrated circuit 1000_1 based on the test output signal TEST_OUT received from the integrated circuit 1000_1. For example, the test equipment 2 may determine parameters, such as the temperature coefficient T_COEF, the offset coefficient O_COEF, and the offset code O_CODE, based on the test output signal TEST_OUT received from the integrated circuit 1000_1. The test equipment 2 may generate the external signal EXT_SIG and may transmit the external signal EXT_SIG to the integrated circuit 1000_1 in order to write the determined temperature coefficient T_COEF, the offset coefficient O_COEF, and the offset code O_CODE to a nonvolatile memory 1500_1 of the integrated circuit 1000_1.

The integrated circuit 1000_1 (or the control logic 1220a of FIG. 8) may write the temperature coefficient T_COEF, the offset coefficient O_COEF, and the offset code O_CODE that are determined by the test equipment 2 to the nonvolatile memory 1500_1 in response to the external signal EXT_SIG. According to an embodiment, the nonvolatile memory 1500_1 may be a one-time programmable (OTP) memory, and the temperature coefficient T_COEF, the offset coefficient O_COEF, and the offset code O_CODE may be programmed to the nonvolatile memory 1500_1.

Referring to FIG. 9B, an integrated circuit 1000_2 may be included in a computing system 100, and the computing system 100 may include the integrated circuit 1000_2 and a controller 110. The computing system 100 may be any one of stationary or mobile computing systems such as a desktop computer, a server, a workstation, a laptop computer, a tablet computer, a personal digital assistant (PDA), a mobile phone, or a smartphone.

The controller 110 may control an operation of the computing system 100 or may control the integrated circuit 1000_2, and may include firmware 111. The firmware 111 that is software for defining an operation of the controller 110 may include a plurality of instructions. The plurality of instructions may be stored in a memory included in the controller 110, and a processor included in the controller 110 may operate by executing the plurality of instructions. Also, the firmware 111 may include information about parameters for removing an error of the reference voltage V_REF that is generated in the integrated circuit 1000_2, that is, the temperature coefficient T_COEF, the offset coefficient O_COEF, and the offset code O_CODE.

The firmware 111 may be updated according to an embodiment. That is, the firmware 111 may be updated based on data provided from the outside of the computing system 100, for example, data received through wireless or wired communication or data stored in a portable recording medium. Accordingly, the information about the parameters included in the firmware 111 may also be updated. The controller 110 may generate the external signal EXT_SIG based on the updated firmware 111 and may transmit the external signal EXT_SIG to the integrated circuit 1000_2.

As shown in FIG. 9B, the integrated circuit 1000_2 may include a nonvolatile memory 1500_2, and may receive the external signal EXT_SIG from the controller 110. The integrated circuit 1000_2 may write the temperature coefficient T_COEF, the offset coefficient O_COEF, and the offset code O_CODE stored in the nonvolatile memory 1500_2 in response to the external signal EXT_SIG received from the controller 110. Accordingly, when the nonvolatile memory 1500_2 stores the temperature coefficient T_COEF, the offset coefficient O_COEF, and the offset code O_CODE, the temperature coefficient T_COEF, the offset coefficient O_COEF, and the offset code O_CODE may be updated to have new values.

Figure 10:
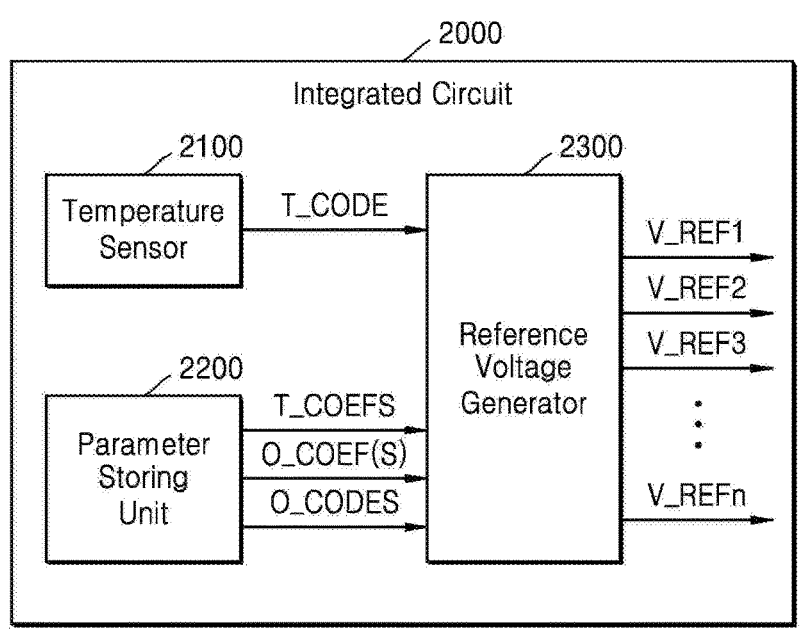
FIG. 10 is a block diagram of an integrated circuited according to an embodiment.

FIG. 10 is a block diagram of an integrated circuit 2000 according to one embodiment. According to an embodiment, the integrated circuit 2000 may use a plurality of reference voltages V_REF1 through V_REFn having different levels or different NTCs or PTCs, and the plurality of reference voltages V_REF1 through V_REFn may be generated in the integrated circuit 2000. As shown in FIG. 10, the integrated circuit 2000 may include a temperature sensor 2100, a parameter storage unit 2200, and a reference voltage generator (or a reference voltage generating circuit) 2300. Like the temperature sensor 1100 of FIG. 1, the temperature sensor 2100 may detect a temperature of the integrated circuit 2000, may generate the temperature code T_CODE, and may provide the temperature code T_CODE to the reference voltage generator 2300.

The parameter storage unit 2200 may store a plurality of parameters corresponding to the plurality of reference voltages V_REF1 through V_REFn. As shown in FIG. 10, the parameter storage unit 2200 may include a plurality of temperature coefficients T_COEFS, a plurality of offset coefficients O_COEFS, and a plurality of offset codes O_CODES respectively corresponding to the plurality of reference voltages V_REF1 through V_REFn. Each of the plurality of temperature coefficients T_COEFS may have a value that is determined based on characteristics of a device to which a corresponding reference voltage is applied. Likewise, each of the plurality of offset coefficients O_COEFS and the plurality of offset codes O_CODES may have a value that is determined by an error caused by a DAC. Alternatively, the parameter storage unit 2200 may store the plurality of temperature coefficients T_COEFS and the plurality of offset coefficients O_COEFS respectively corresponding to the plurality of reference voltages V_REF1 through V_REFn, and may store one offset coefficient O_COEF. That is, the offset coefficient O_COEFS may be commonly used. The plurality of offset coefficients O_COEFS or one offset coefficient O_COEF will be explained below in detail with reference to FIGS. 11A and 11B.

The reference voltage generator 2300 may generate the plurality of reference voltages V_REF1 through V_REFn by performing a digital calculation using the temperature code T_CODE, the plurality of temperature coefficients T_COEFS, the plurality of offset coefficients O_COEFS (or one offset coefficient O_COEF), and the plurality of offset codes O_CODES. For example, the reference voltage generator 2300 may perform a digital calculation on the temperature code T_CODE, one of the plurality of temperature coefficients T_COEFS, one of the plurality of offset coefficients O_COEFS (or one offset coefficient O_COEF), and one of the plurality of offset codes O_CODES, in order to generate the first reference voltage V_REF1.

Figure 11A:
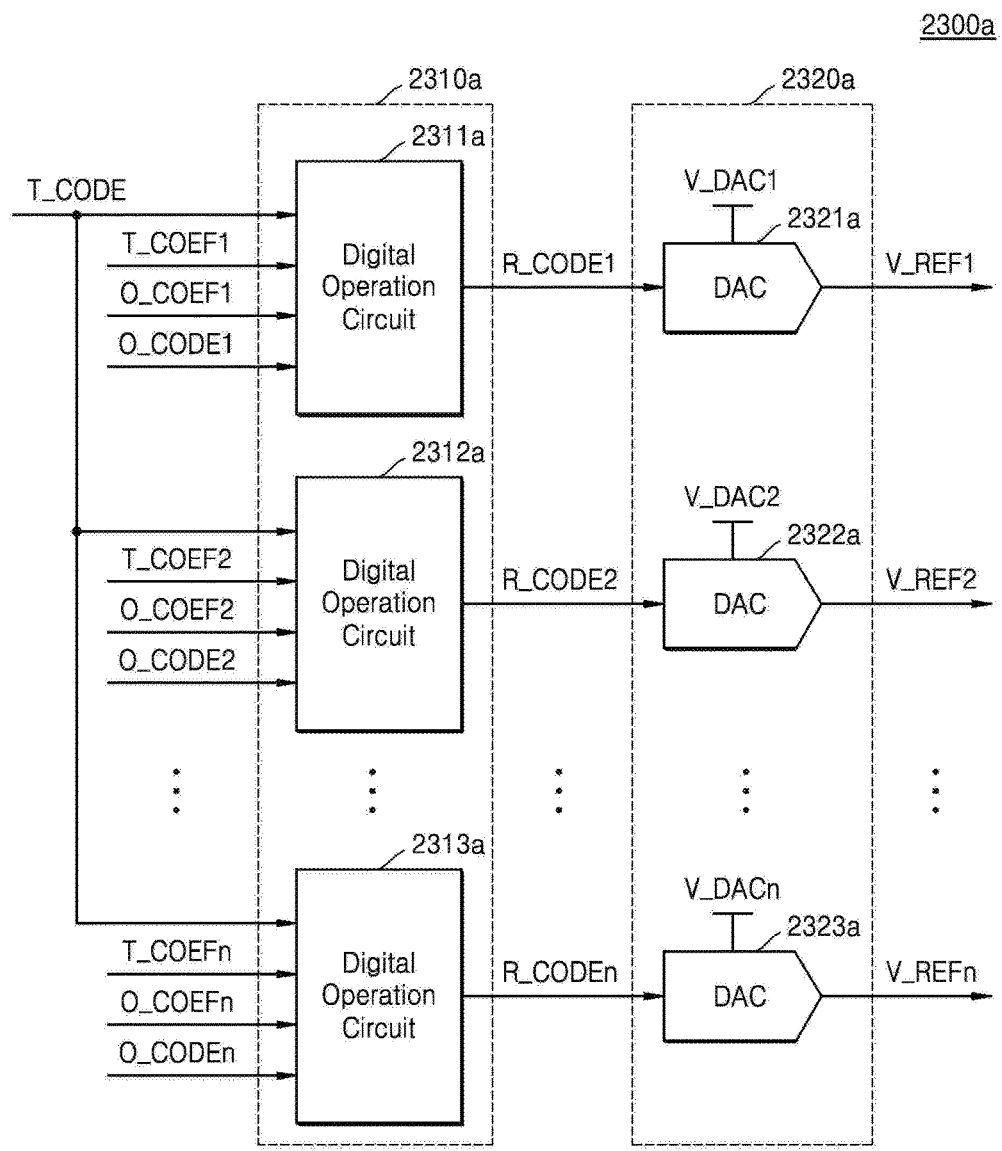
FIGS. 11A and 11B are diagrams illustrating examples of a reference voltage generator of FIG. 10 according to certain embodiments.
Figure 11B:
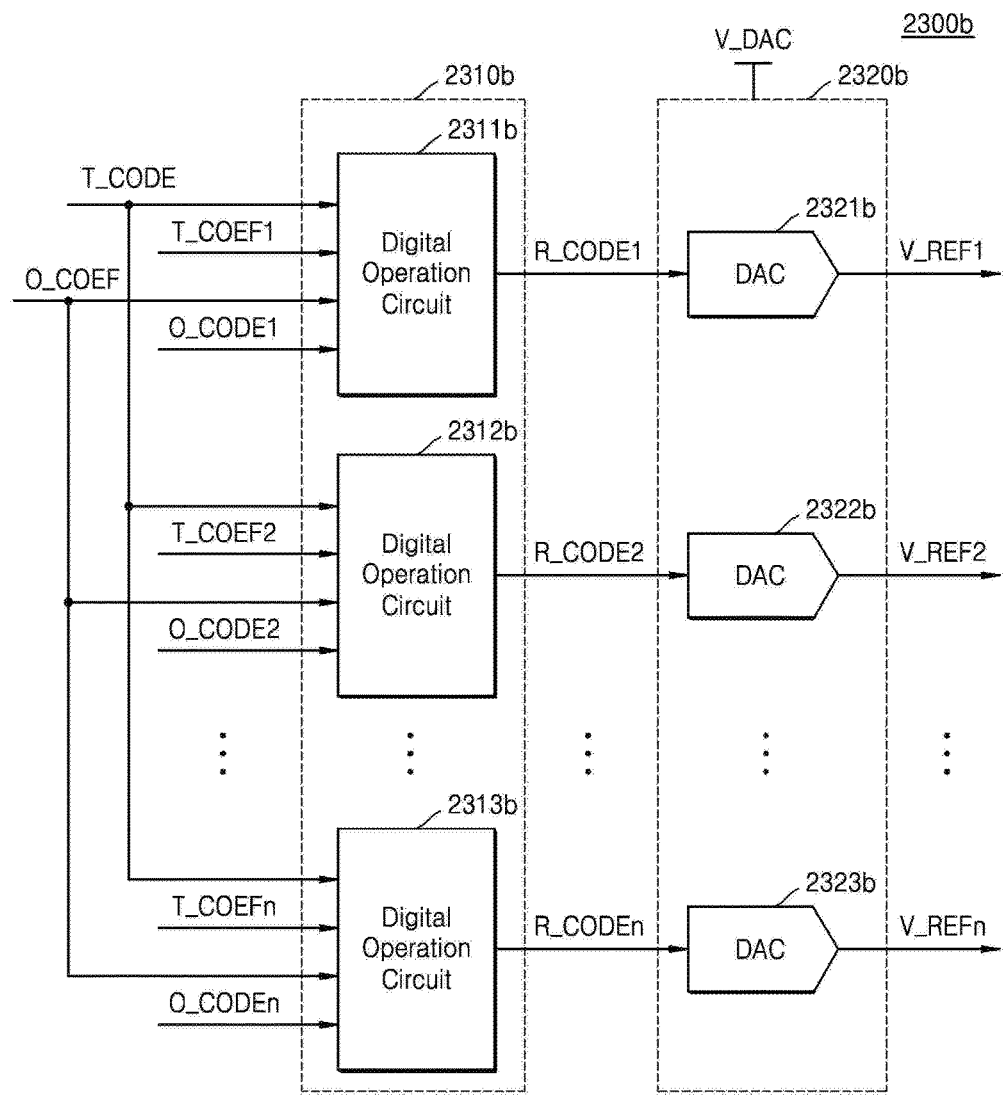

FIGS. 11A and 11B are diagrams illustrating examples of the reference voltage generator 2300 of FIG. 10 according to embodiments. In detail, FIG. 11A illustrates a reference voltage generator 2300a that uses the plurality of offset coefficients O_COEFS in order to generate the plurality of reference voltages V_REF1 through V_REFn, and FIG. 11B illustrates a reference voltage generator 2300b that uses one offset coefficient O_COEF in order to generate the plurality of reference voltages V_REF1 through V_REFn. FIGS. 11A and 11B will be sequentially explained, and the same elements as those in FIG. 1A will not be explained in FIG. 11B.

Referring to FIG. 11A, the reference voltage generator 2300a may include a digital processing circuit 2310a and a multi-channel DAC 2320a. As shown in FIG. 11A, the digital processing circuit 2310a may include a plurality of digital operation circuits 2311a through 2313a, and each of the plurality of digital operation circuits 2311a trough 2313a may generate one of a plurality of reference codes R_CODE1 through R_CODEn by performing digital calculation on the temperature code T_CODE, one of the plurality of temperature coefficients T_COEFS, one of the plurality of offset coefficients O_COEFS, and one of the plurality of offset codes O_CODES. For example, the first digital operation circuit 2311a may receive the temperature code T_CODE, a first temperature coefficient T_COEF1, a first offset coefficient O_COEF1, and a first offset code O_CODE1, and may generate the first reference code R_CODE1 by performing digital calculation on the received temperature code T_CODE and the received parameters. According to one embodiment, the plurality of digital operation circuits 2311a through 2313a may be the same and may each have the same structure as that of FIG. 6.

The multi-channel DAC 2320a may receive the plurality of reference codes R_CODE1 through R_CODEn, and may generate analog signals corresponding to the plurality of reference codes R_CODE1 through R_CODEn as the plurality of reference voltages V_REF1 through V_REFn. As shown in FIG. 11A, the multi-channel DAC 2320a may include a plurality of DACs (or single-channel DACs) 2321a through 2323a. The plurality of DACs 2321a through 2323a may respectively receive and refer to a plurality of DAC voltages V_DAC1 through V_DACn. Each of the plurality of offset coefficients O_COEFS and the plurality of offset codes O_CODES may have a value that is determined in order to remove an error caused by each of the plurality of DACs 2321a through 2323a. According to an embodiment, the plurality of DACs 2321a through 2323a may be the same and may each have the same structure as that of FIG. 3A or 3B.

Referring to FIG. 11B, a reference voltage generator 2300b may include a digital processing circuit 2310b and a multi-channel DAC 2320b. The digital processing circuit 2310b may include a plurality of digital operation circuits 2311b through 2313b. Unlike the digital operation circuits 2311a through 2313a of FIG. 11A, the plurality of digital operation circuits 2311b through 2313b may share the offset coefficient O_COEF.

The multi-channel DAC 2320b may include a plurality of DACs (or single-channel DACs) 2321b through 2323b. The plurality of DACs 2321b through 2323b may receive and refer to the DAC voltage V_DAC. According to one embodiment, when the plurality of DACs 2321b through 2323b refer to the same DAC voltage V_DAC, one offset coefficient O_COEF may be shared by the plurality of digital operation circuits 2311b through 2313b. In FIGS. 11A and 11B, though certain digital operation circuits may receive different coefficients via separate channels, in some situations, the values of the different coefficients may be the same, and in other situations, the values of the different coefficients may be different. The values may be determined based on the various methods, such as described previously in connection with FIGS. 9A and 9B, for example.

Figure 12:
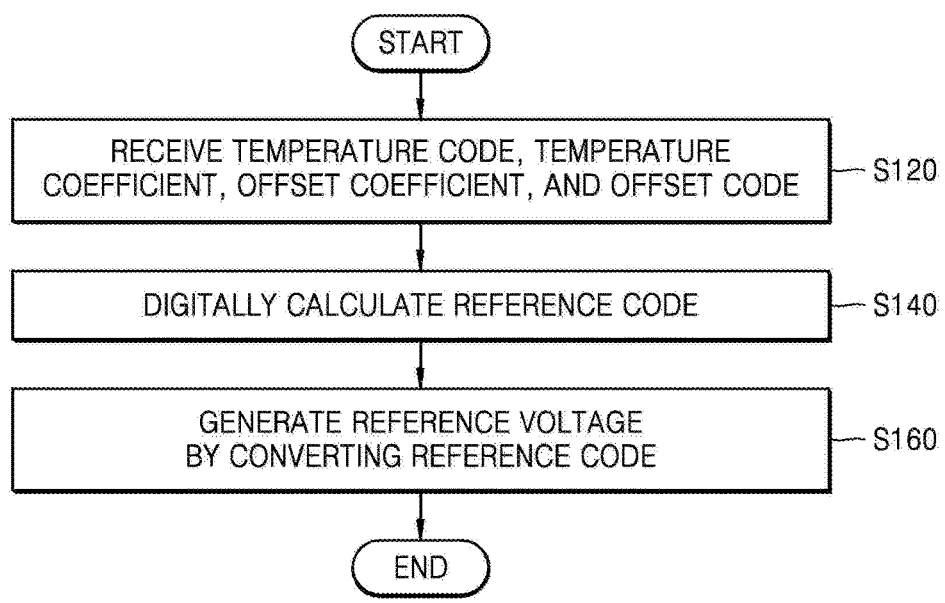
FIG. 12 is a flowchart of a method of generating a reference voltage according to one embodiment.

FIG. 12 is a flowchart of a method of generating a reference voltage according to one embodiment. According to one embodiment, the method of FIG. 12 may be performed by the reference voltage generator 1300 of FIG. 1. As shown in FIG. 12, the method may include operations S120, S140, and S160. FIG. 12 will be explained with reference to FIG. 1.

In operation S120, the temperature code T_CODE, the temperature coefficient T_COEF, the offset coefficient O_COEF, and the offset code O_CODE may be received. For example, the reference voltage generator 1300 may receive the temperature code T_CODE from the temperature sensor 1100, and may receive the temperature coefficient T_COEF, the offset coefficient O_COEF, and the offset code O_CODE from the parameter storage unit 1200. The temperature code T_CODE, the temperature coefficient T_COEF, the offset coefficient O_COEF, and the offset code O_CODE may be digital signals.

In operation S140, the reference code R_CODE may be digitally calculated. For example, the reference voltage generator 1300 may include a digital processing circuit (for example, the digital processing circuit 1310a of FIG. 6), and the digital processing circuit may add the temperature coefficient T_COEF and the offset coefficient O_COEF and may generate the reference code R_CODE by adding a product of the temperature code T_CODE and a sum of the temperature coefficient T_COEF and the offset coefficient O_COEF to the offset code O_CODE.

In operation S160, the reference voltage V_REF may be generated by converting the reference code R_CODE. For example, the reference voltage generator 1300 may include a DAC (for example, the DAC 1320 of FIG. 2), and the DAC may generate the reference voltage V_REF that is an analog signal by converting the reference code R_CODE that is a digital signal.

Figure 13:
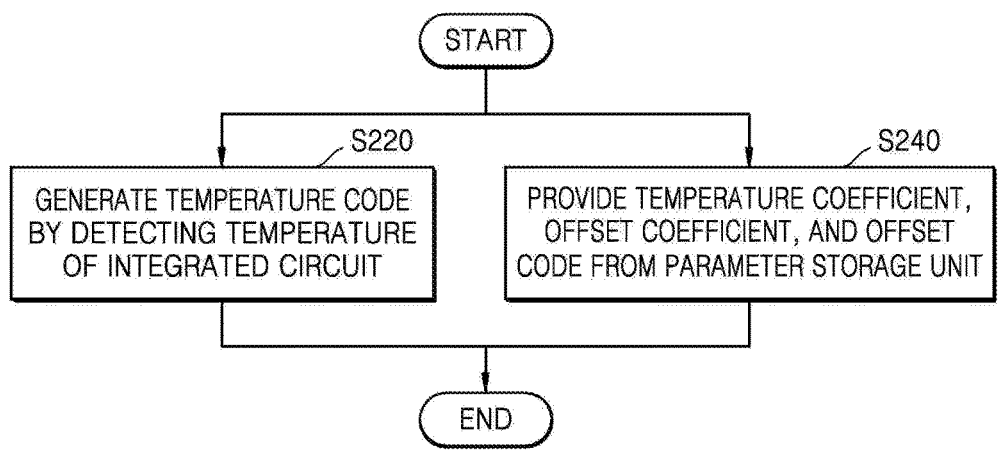
FIG. 13 is a flowchart of a method of providing an input for generating a reference voltage according to one embodiment.

FIG. 13 is a flowchart of a method of providing an input for generating a reference voltage according to one embodiment. As described above with reference to FIG. 12, the method of FIG. 13 may involve generating the reference voltage V_REF by using the temperature code T_CODE, the temperature coefficient T_COEF, the offset coefficient O_COEF, and the offset code O_CODE. As shown in FIG. 13, the method may include operations S220 and S240. FIG. 13 will be explained with reference to FIG. 1.

In operation S220, the temperature code T_CODE may be generated by detecting a temperature of the integrated circuit 1000. For example, the temperature sensor 1100 may detect a temperature of the integrated circuit 1000 and may generate a digital signal corresponding to the detected temperature as the temperature code T_CODE. According to an embodiment, the temperature code T_CODE may be periodically generated, and may be generated when a specific event, for example, a temperature detection request, is received or a change amount of a temperature exceeds a preset reference value.

In operation S240, the temperature coefficient T_COEF, the offset coefficient O_COEF, and the offset code O_CODE are provided from the parameter storage unit 1200. For example, the parameter storage unit 1200 may store the temperature coefficient T_COEF, the offset coefficient O_COEF, and the offset code O_CODE written before shipping of the integrated circuit 1000 or updated after shipping of the integrated circuit 1000. The parameter storage unit 1200 may provide the stored temperature coefficient T_COEF, the stored offset coefficient O_COEF, and the stored offset code O_CODE to the reference voltage generator 1300. Also, when the plurality of reference voltages V_REF1 through V_REFn are generated by the reference voltage generator 2300 as shown in FIG. 10, the parameter storage unit 1200 may provide the plurality of temperature coefficients T_COEFS, at least one offset coefficient O_COEFS or O_COEF, and the plurality of offset codes O_CODES to the reference voltage generator 2300.

According to certain embodiments of the method described above, a reference voltage for an integrated circuit can be generated. In generating the reference voltage, a first circuit can be used to change the gradient of the relationship between the reference voltage and a temperature code that represents a temperature of the integrated circuit. A second circuit can be used to change an offset of the reference voltage with respect to a given temperature code (e.g., to raise or lower the reference voltage by a constant amount across a range of temperatures). By using both of these circuits together, a reference voltage can be output that maintains a consistent reference voltage to temperature relationship for the integrated circuit even when certain parameters, such as an inputted voltage which may be a digital-to-analog converter voltage used to generate the reference voltage, deviate from a desired value.

Figure 14:
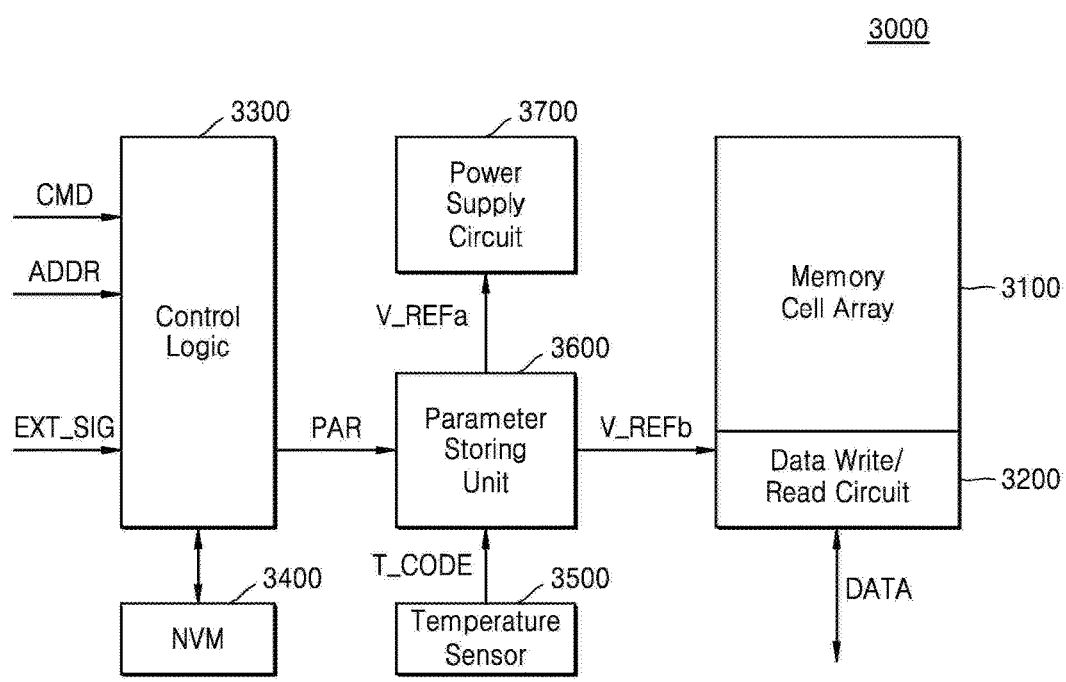
FIG. 14 is a block diagram of an integrated circuit including a reference voltage generator according to an embodiment.

FIG. 14 is a block diagram of an integrated circuit 3000 including a reference voltage generator 3600 according to one embodiment. According to one embodiment, the integrated circuit 3000 including the reference voltage generator 3600 may be a semiconductor memory device. For example, the integrated circuit 3000 may be a nonvolatile memory device such as an EEPROM, a flash memory, a PRAM, an RRAM, an NFGM, a PoRAM, an MRAM, or an FRAM. Alternatively, the integrated circuit 3000 may be a volatile memory device such as a dynamic random-access memory (DRAM), a static random-access memory (SRAM), a mobile DRAM, a double data rate synchronous dynamic random-access memory (DDR SDRAM), a low power DDR (LPDDR) SDRAM, a graphic DDR (GDDR) SDRAM, or a Rambus dynamic random-access memory (RDRAM). Referring to FIG. 14, the integrated circuit 3000 may include a memory cell array 3100, a data write/read circuit 3200, a control logic 3300, a nonvolatile memory 3400, a temperature sensor 3500, the reference voltage generator 3600, and a power supply circuit 3700. The integrated circuit 3000 may form a semiconductor device such as a semiconductor chip formed on a die from a wafer, a semiconductor package including one or more semiconductor chips formed on a package substrate, a package-on-package device. The semiconductor device may be one of the above types devices.

The memory cell array 3100 may include a plurality of memory cells having states corresponding to stored data. The data write/read circuit 3200 may write data DATA received from the outside to the plurality of memory cells or may read data DATA stored in the plurality of memory cells by generating a plurality of selection signals and bias signals.

The control logic 3300 may receive a command CMD, an address ADDR, and the external signal EXT_SIG from the outside of the integrated circuit 3000, and may generate a plurality of control signals for controlling other elements of the integrated circuit 3000. According to one embodiment, the control logic 3300 may write a plurality of parameters used to generate reference voltages V_REFa and V_REFb to the nonvolatile memory 3400 based on the external signal EXT_SIG. Also, the control logic 3300 may access the nonvolatile memory 3400, may read a plurality of parameters PAR stored in the nonvolatile memory 3400, and may provide the read parameters PAR to the reference voltage generator 3600.

The nonvolatile memory 3400 may store parameters used to generate the reference voltages V_REFa and V_REFb, for example, the temperature coefficient T_COEF, the offset coefficient O_COEF, and the offset code O_CODE, and the temperature coefficient T_COEF, the offset coefficient O_COEF, and the offset code O_CODE may not be lost even when power supplied to the integrated circuit 3000 is cut off.

The temperature sensor 3500 may detect a temperature of the integrated circuit 3000, and may generate a digital signal corresponding to the detected temperature as the temperature code T_CODE. The power supply circuit 3700 may generate a power voltage or a power current from power supplied from the outside of the integrated circuit 3000, and may provide the power voltage or the power current to elements of the integrated circuit 3000.

The reference voltage generator 3600 may generate the reference voltages V_REFa and V_REFb by performing digital calculation on the parameters PAR received from the control logic 3300 and the temperature code T_CODE received from the temperature sensor 3500. The reference voltage V_REFa provided to the power supply circuit 3700 may be used to determine a level of the power voltage or the power current generated by the power supply circuit 3700. Also, the reference voltage V_REFb provided to the data write/read circuit 3200 may be used to determine a level of a program voltage for writing data or to determine a level of a read voltage for reading data.

The power supply circuit 3700 and the data write/read circuit 3200 respectively receiving the reference voltages V_REFa and V_REFb may include devices having characteristics that change according to a temperature change, and the reference voltage generator 3600 may provide the reference voltages V_REFa and V_REFb that are accurate in order to compensate for the characteristics of the devices. Accordingly, the elements of the integrated circuit 3000 may receive the power voltage or the power current that is accurate from the power supply circuit 3700, and a normal operation of writing and reading data may be accurately performed by the data write/read circuit 3200.

Figure 15:
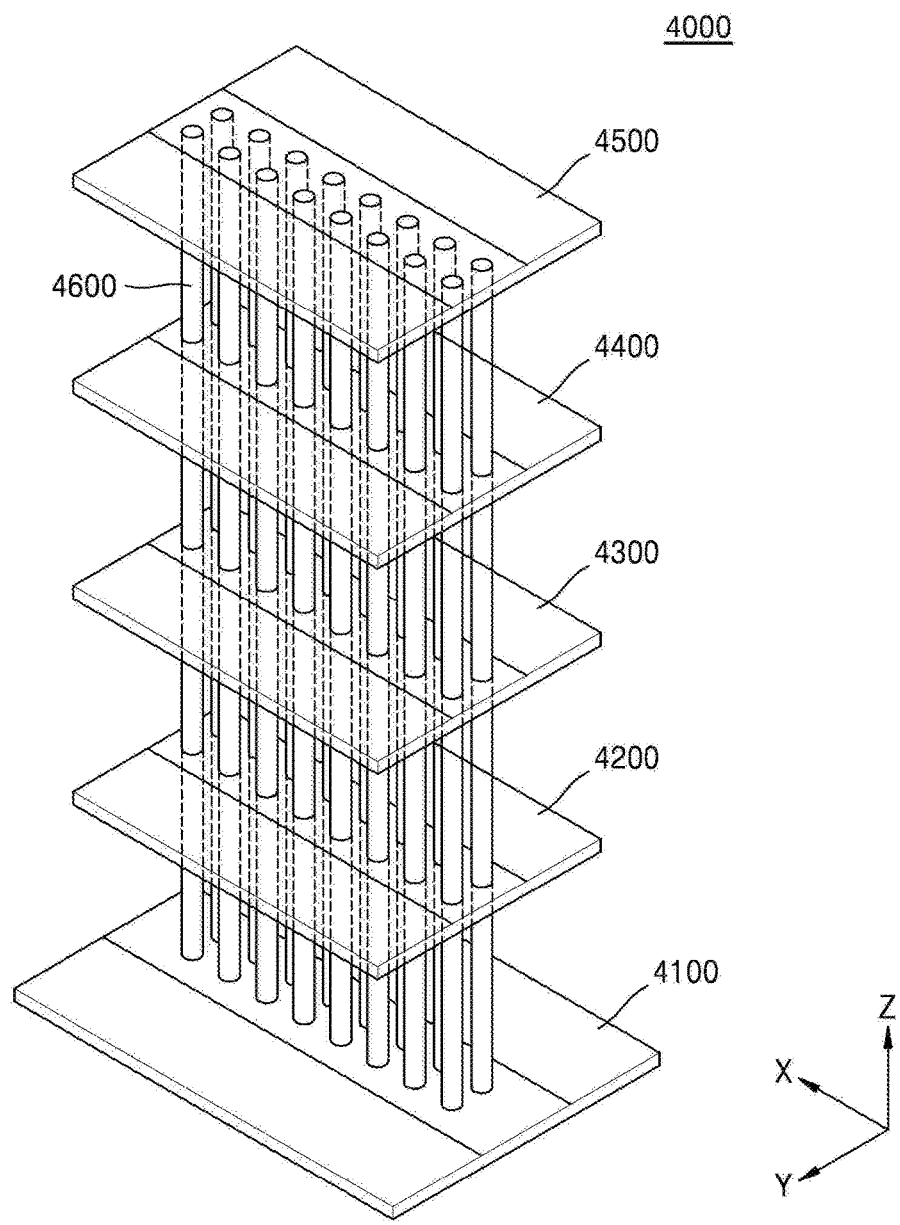
FIG. 15 is a view of an integrated circuit according to one embodiment.

FIG. 15 is a view of an integrated circuit device 4000 according to one embodiment. According to this embodiment, the integrated circuit device 4000 may include a plurality of semiconductor chips that are stacked. For example, as shown in FIG. 15, the integrated circuit device 4000 may be a semiconductor memory device, and may include an interface chip 4100 and a plurality of memory chips 4200 through 4500. The interface chip 4100 and the plurality of memory chips 4200 through 4500 may be connected to one another via through-substrate vias (TSVs, such as through-silicon vias) 4600.

Each of the plurality of memory chips 4200 through 4500 may include a memory cell array, and the interface chip 4100 may include a temperature sensor, a parameter storage unit, and a reference voltage generator. The reference voltage generator included in the interface chip 4100 may operate according to any one of the above embodiments. For example, the reference voltage generator may calculate a reference code by digitally calculating a temperature code received from a temperature sensor and parameters received from a parameter storage unit, and may generate a reference voltage by converting the reference code.

Figure 16:
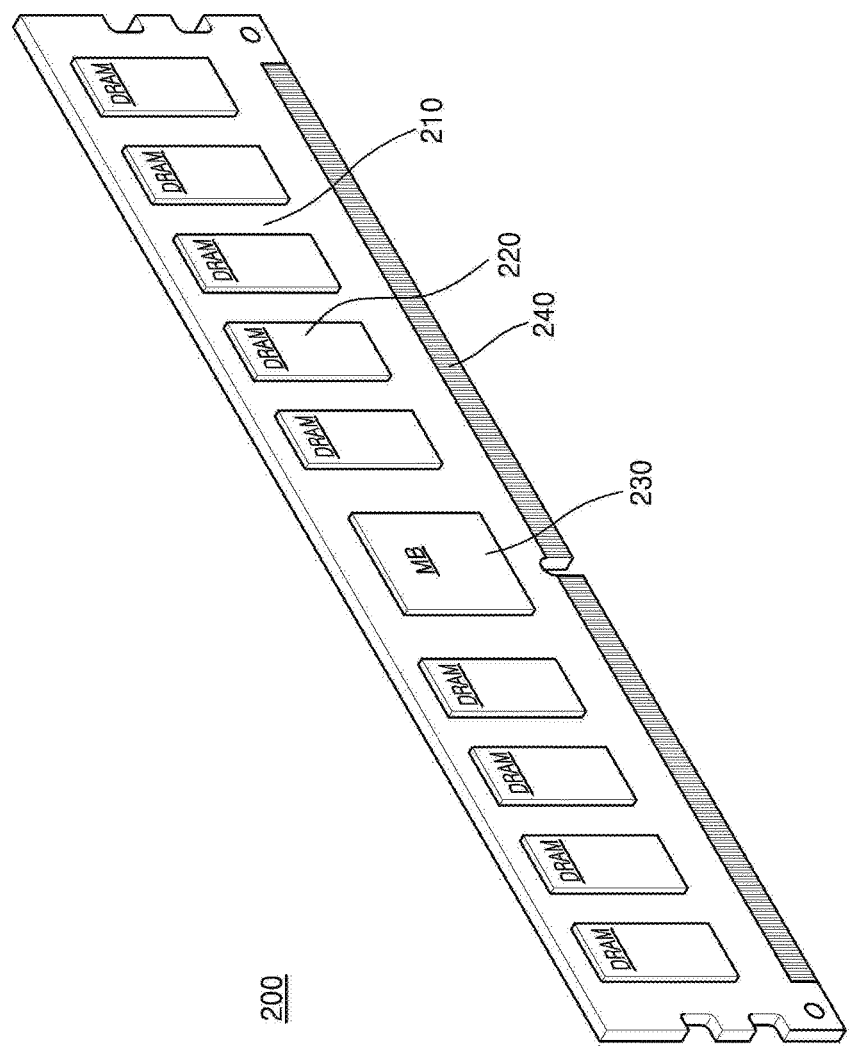
FIG. 16 is a view of a memory module including an integrated circuit according to one embodiment.

FIG. 16 is a view of a memory module 200 including an integrated circuit according to one embodiment. The integrated circuit according to one embodiment may be a memory device such as a DRAM. The memory module 200 may include DRAM devices and may be applied to a single in-line memory module (SIMM), a dual in-line memory module (DIMM), a small-outline DIMM (SO-DIMM), a unbuffered DIMM (UDIMM), a fully-buffered DIMM (FB-DIMM), a rank-buffered DIMM (RBDIMM), a load-reduced DIMM (LRDIMM), a mini-DIMM, or a micro-DIMM.

As shown in FIG. 16, the memory module 200 may include a printed circuit board (PCB) 210, a plurality of DRAM chips 220, a buffer chip 230, and a connector 240. The plurality of DRAM chips 220 and the buffer chip 230 may communicate with a memory controller outside the memory module 200 through the connector 240.

Each of the plurality of DRAM chips 220 may include a temperature sensor, a parameter storage unit, and a reference voltage generator. The reference voltage generator included in each of the DRAM chips 220 may operate according to any one of the above embodiments. For example, the reference voltage generator may calculate a reference code by digitally calculating a temperature code received from the temperature sensor and parameters received from the parameter storage unit and may generate a reference voltage by converting the reference code.

The buffer chip 230 may communicate with the plurality of DRAM chips 220, and may temporarily store data received from the outside of the memory module 200 or data transmitted to the outside of the memory module 200. Also, the buffer chip 230 may receive the external signal EXT_SIG from the outside of the memory module 200 and may transmit the external signal EXT_SIG to the plurality of DRAM chips 220. Each of the plurality of DRAM chips 220 may write parameters to the parameter storage unit in response to the received external signal EXT_SIG.

Figure 17:
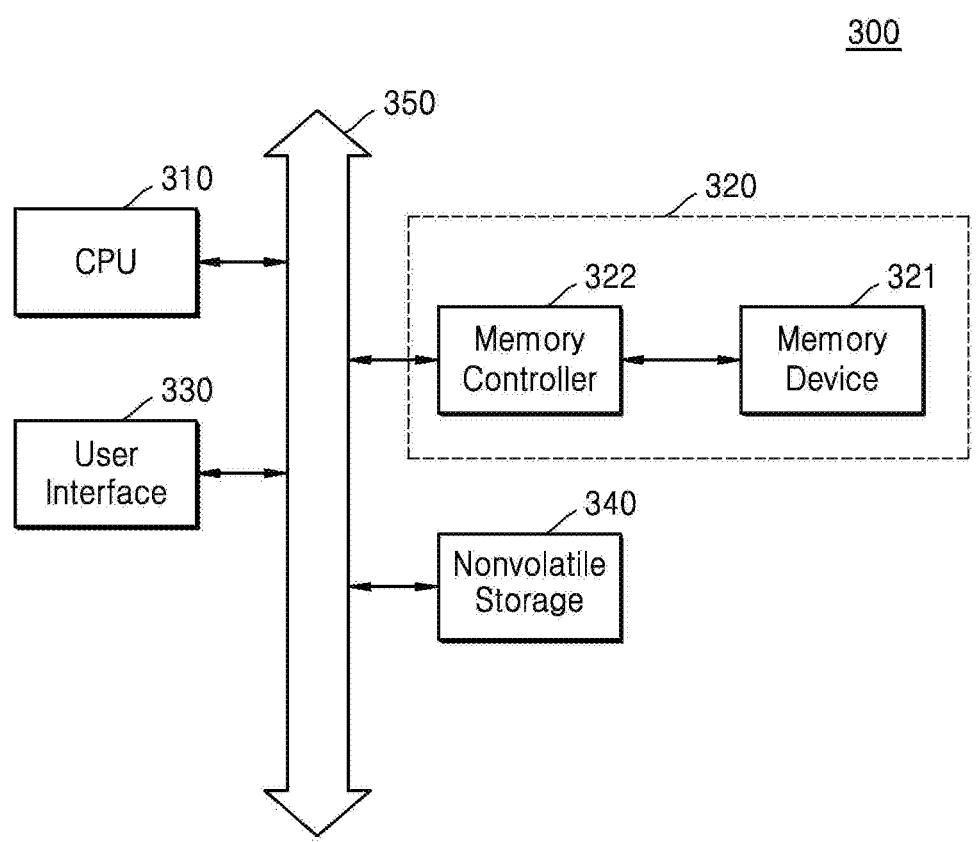
FIG. 17 is a block diagram of a computing system according to one embodiment.

FIG. 17 is a block diagram of a computing system 300 according to one embodiment. As shown in FIG. 17, the computing system 300 may include a central processing unit (CPU) 310, a memory system 320, a user interface 330 and a nonvolatile storage device 340. The CPU 310, the memory system 320, the user interface 330, and the nonvolatile storage device 340 may communicate with one another via a bus 350. Although not shown in FIG. 17, the computing system 300 may communicate with a video card, a sound card, a memory card, or a universal serial bus (USB), or may further include ports for communication with other electronic devices. The computing system 300 may be a personal computer, a server, or a portable electronic device such as a notebook computer, a mobile phone, a PDA, or a camera.

The CPU 310 may perform specific calculations or tasks. According to an embodiment, the CPU 310 may be a micro-processor or a graphics processing unit (GPU). The CPU 310 may communicate with the memory system 320, the user interface 330, and the nonvolatile storage device 340 via the bus 350. The CPU 310 may be connected to an extended bus such as a peripheral component interconnect (PCI) bus.

The memory system 320 may include a memory device 321 and a memory controller 322, and may store data needed to operate the computing system 300. For example, the memory system 320 may function as a data memory of the CPU 310, and may store data received from the bus 350 or may transmit stored data to the bus 350 by supporting a direct memory access (DMA). An integrated circuit according to an embodiment may be included as the memory device 321 in the memory system 320. For example, the memory device 321 may include a temperature sensor, a parameter storage unit, and a reference voltage generator, and the reference voltage generator may operate according to any one of the above embodiments. For example, the reference voltage generator may calculate a reference code by digitally calculating a temperature code received from the temperature sensor and parameters received from the parameter storage unit, and may generate a reference voltage by converting the reference code.

The user interface 330 may include an input unit such as a keyboard, a keypad, or a mouse in order to receive an input signal from a user, and may include an output unit such as a printer or a display device in order to provide an output signal to the user.

The nonvolatile storage device 340 may include a nonvolatile semiconductor memory device such as an EEPROM, a flash memory, a PRAM, an RRAM, an NFGM, a PoRAM, an MRAM, or an FRAM, and may include a magnetic disc.

While various aspects of the inventive concept has been particularly shown and described with reference to embodiments thereof by using specific terms, the embodiments and terms have merely been used to explain examples of the inventive concept and should not be construed as limiting the scope of the inventive concept. The embodiments should be considered in a descriptive sense only and not for purposes of limitation.

What is claimed is:

1. An integrated circuit comprising:
a temperature sensor configured to provide a temperature code by detecting a temperature of the integrated circuit;
a parameter storage circuit configured to store and provide a temperature coefficient for adjusting a relative change amount of a reference voltage that varies in relation to the temperature of the integrated circuit, an offset code for compensating for a first, absolute offset of the reference voltage, and an offset coefficient for compensating for a second, relative offset of the reference voltage in relation to the temperature of the integrated circuit; and
a reference voltage generating circuit configured to generate the reference voltage by performing a digital calculation on the temperature code, the temperature coefficient, the offset code, and the offset coefficient.

2. The integrated circuit of claim 1, wherein the parameter storage circuit provides a plurality of temperature coefficients, a plurality of offset codes, and at least one offset coefficient,
wherein the reference voltage generating circuit provides a plurality of reference voltages by performing a digital calculation on the temperature code, the plurality of temperature coefficients, the plurality of offset codes, and the at least one offset coefficient.

3. The integrated circuit of claim 2, wherein the reference voltage generating circuit comprises a plurality of digital operation circuits configured to generate a plurality of reference codes and a multi-channel digital-to-analog converter (DAC) configured to generate the plurality of reference voltages by converting the plurality of reference codes,
wherein each of the plurality of digital operation circuits is configured to generate one of the plurality of reference codes by performing a digital calculation on the temperature code, one of the plurality of temperature coefficients, one of the plurality of offset codes, and one of the at least one offset coefficient.

4. The integrated circuit of claim 3, wherein each of the plurality of digital operation circuits is configured to add one of the plurality of temperature coefficients and one of the at least one offset coefficient to obtain a sum, and generate one of the plurality of reference codes by adding a product of the temperature code and the sum to the offset code.

5. The integrated circuit of claim 4, wherein each of the plurality of digital operation circuits comprises:
a first adder configured to add one of the plurality of temperature coefficients and one of the at least one offset coefficient;
a multiplier configured to multiply an output of the first adder by the temperature code; and
a second adder configured to add an output of the multiplier and one of the plurality of offset codes.

6. The integrated circuit of claim 3, wherein the multi-channel DAC comprises a plurality of resistors connected in series and a plurality of analog multiplexers each connected to at least two nodes of a plurality of nodes formed by the plurality of resistors,
wherein each of the plurality of analog multiplexers is configured to output a voltage of one of the at least two nodes based on one of the plurality of reference codes as one of the plurality of reference voltages.

7. The integrated circuit of claim 3, wherein the multi-channel DAC comprises a plurality of single-channel DACs configured to respectively convert the plurality of reference codes,
wherein each of the plurality of single-channel DACs comprises a current source configured to provide a reference current and a variable resistor configured to allow the reference current to pass therethrough and having a resistance that changes according to one of the plurality of reference codes.

8. The integrated circuit of claim 3, wherein each of the plurality of temperature coefficients depends on characteristics of a circuit to which a corresponding reference voltage is provided, and the plurality of offset codes and the at least one offset coefficient depend on characteristics of the multi-channel DAC.

9. The integrated circuit of claim 1, wherein the parameter storage circuit comprises a nonvolatile memory,
wherein the nonvolatile memory is configured to store the temperature coefficient, the offset code, and the offset coefficient.

10. The integrated circuit of claim 9, wherein the nonvolatile memory is a one-time programmable (OTP) memory,
wherein the OTP memory is programmed when the integrated circuit is tested.

11. The integrated circuit of claim 9, wherein the temperature coefficient, the offset code, and the offset coefficient stored in the nonvolatile memory are updated based on a signal received from the outside of the integrated circuit.

12. The integrated circuit of claim 1, wherein the integrated circuit is a semiconductor memory device and further comprises a data write/read circuit and a power supply circuit,
wherein the reference voltage is used to operate the data write/read circuit or the power supply circuit.

13. An integrated circuit including a reference voltage generating circuit for generating a reference voltage, the reference voltage generating circuit comprising:
a digital operation circuit configured to adjust a reference voltage to temperature code relationship using a coefficient that adjusts a relative relationship between the reference voltage and the temperature code, and separate code that adjusts an absolute relationship between the reference voltage and the temperature code, wherein the temperature code reflects a temperature at the integrated circuit; and
a digital-to-analog converter (DAC) configured to generate the reference voltage based on an output from the digital operation circuit.

14. The integrated circuit of claim 13, wherein the digital operation circuit is further configured to:
generate a reference code by performing a digital calculation on the temperature code, the coefficient, and the separate code; and
the DAC is configured to generate the reference voltage by converting the reference code.

15. The reference voltage generating circuit of claim 14, wherein the digital operation circuit generates the reference code by adding a product of the temperature code and the coefficient to the separate code.

16. The reference voltage generating circuit of claim 15, wherein coefficient is a combination of a temperature coefficient and an offset coefficient and the separate code is an offset code, and the digital operation circuit comprises:
a first adder configured to add the temperature coefficient and the offset coefficient;
a multiplier configured to multiply an output of the first adder by the temperature code; and
a second adder configured to add an output of the multiplier and the offset code.

17. The reference voltage generating circuit of claim 16, wherein the temperature coefficient depends on characteristics of a circuit to which a corresponding reference voltage is provided, and
the offset code and the offset coefficient depend on characteristics of the DAC.

18. A method of generating a reference voltage in an integrated circuit, the method comprising:
(a) receiving a temperature code for indicating a temperature of the integrated circuit;
(b) adjusting a reference voltage to temperature code relationship using a first coefficient that adjusts a gradient of a relationship between the reference voltage and the temperature code;
(c) adjusting the reference voltage to temperature code relationship using an offset code that equally offsets the value of each reference voltage in relation to a corresponding temperature code; and
(d) generating the reference voltage based on the adjusted reference voltage to temperature code relationship from (b) and (c).

19. The method of claim 18, wherein:
the first coefficient includes a temperature coefficient added to an offset coefficient, and
adjusting the reference voltage is performed by generating a reference code by performing a digital calculation on the temperature coefficient, offset coefficient, temperature code, and offset code, and converting the reference code to the reference voltage.

20. The method of claim 19, wherein the generating of the reference code comprises:
multiplying the temperature code by the temperature coefficient;
multiplying the temperature code by the offset coefficient;
adding a product of the temperature code and the temperature coefficient and a product of the temperature code and the offset coefficient; and
adding the offset code.

* * * * *